(12) United States Patent
Yamada et al.

(10) Patent No.: US 6,645,881 B2
(45) Date of Patent: Nov. 11, 2003

(54) METHOD OF FORMING COATING FILM, METHOD OF MANUFACTURING SEMICONDUCTOR DEVICE AND COATING SOLUTION

(75) Inventors: Nobuhide Yamada, Tokyo (JP); Rempei Nakata, Iwase Kamakura (JP); Makoto Sugiura, Tsuchiura (JP); Mutsuhiko Yoshioka, Tsukuba (JP); Takahiro Kitano, Koshi-machi (JP); Shinji Kobayashi, Kashi-machi (JP)

(73) Assignees: Kabushiki Kaisha Toshiba, Tokyo (JP); JSR Corporation, Tokyo (JP)

( * ) Notice: Subject to any disclaimer, the term of this patent is extended or adjusted under 35 U.S.C. 154(b) by 0 days.

(21) Appl. No.: 10/112,951

(22) Filed: Apr. 2, 2002

(65) Prior Publication Data

US 2003/0139063 A1 Jul. 24, 2003

(30) Foreign Application Priority Data

Jan. 21, 2002 (JP) ........................................ 2002-012053

(51) Int. Cl.[7] ........................ H01L 21/31; H01L 21/469; B05D 3/12
(52) U.S. Cl. ..................... 438/782; 427/240; 427/372.2
(58) Field of Search ............................... 438/782, 778; 427/240, 372.2, 421

(56) References Cited

U.S. PATENT DOCUMENTS 6,506,453 B2 * 1/2003 Ema et al.
2001/0004467 A1 * 6/2001 Ema et al. .................... 427/2.1
2002/0037367 A1 * 3/2002 Ema et al. ................... 427/240

FOREIGN PATENT DOCUMENTS

JP         2001-170546       6/2001

OTHER PUBLICATIONS

Kobayashi et al., "Optimum drying method for scan coating," 2001 IEEE International Symposium on Semiconductor Manufacturing, Oct. 8–10, 2001, pp. 403–406.

Translation of document entitled "An Explanation of the partial discrepancy between the inventors and the presenters of the invention, stated on a paper requesting the application of the provisions of Section 30(1) of the Patent Law," submitted to the Japanese Patent Office on Feb. 22, 2002, in the Japanese application from which the present application claims priority.

* cited by examiner

Primary Examiner—Alexander Ghyka
(74) Attorney, Agent, or Firm—Finnegan, Henderson, Farabow, Garrett & Dunner, L.L.P.

(57) ABSTRACT

A coating solution for used in a scan coating method contains a low vapor pressure solvent having a vapor pressure lower than 1 Torr (133.322 Pa) at room temperature.

16 Claims, 2 Drawing Sheets

METHOD OF FORMING COATING FILM, METHOD OF MANUFACTURING SEMICONDUCTOR DEVICE AND COATING SOLUTION

CROSS-REFERENCE TO RELATED APPLICATIONS

This application is based upon and claims the benefit of priority from the prior Japanese Patent Application No. 2002-012053, filed Jan. 21, 2002, the entire contents of which are incorporated herein by reference.

BACKGROUND OF THE INVENTION

1. Field of the Invention

The present invention relates to a method of forming a coating film by a so-called "scan coating method", to a method of manufacturing a semiconductor device, and to a coating solution.

2. Description of the Related Art

Semiconductor devices are manufactured through the formation of a coating film or films, such as an interlayer insulating film or a resist film, above a semiconductor substrate. It has been customary to use a spin coating method for forming such a film on the semiconductor substrate. In the spin coating method, a coating solution is dripped onto a substrate while rotating the substrate so as to centrifugally form uniformly a film of the coating solution on the substrate. In the spin coating method, however, the coating solution is scattered by the rotation of the substrate, resulting in loss of the coating solution. Also, where the substrate has a stepped portion, an additional problem is brought about that the coating film formed on the stepped portion is poor in the surface smoothness.

Under the circumstances, a so-called "scan coating method" is being studied in recent years in an attempt to improve the utilization rate of a coating solution and to improve the smoothness in the surface of the coating film when the substrate having a stepped portion is coated with the coating solution. In the scan coating method, a coating solution is discharged through a nozzle onto a substrate while relatively moving the nozzle and the substrate so as to form a continuous coating solution film. Then, the solvent is removed from the coating solution film, forming a desired coating film.

Nowadays, the coating solution used in the spin coating method is often diverted to the scan coating method. In this case, it is possible to improve the uniformity of the coating film on the stepped portion of the substrate, compared with the spin coating method. However, a problem arises that the scan coating method is inferior in general to the spin coating method in the in-plane uniformity in the thickness of the formed coating film. It should also be noted that, in the scan coating method, it is necessary for the liquid lines discharged onto the substrate in the form of, for example, parallel lines or a spiral line to be leveled so as to be joined to each other on the substrate such that the substrate may be covered with a single continuous liquid film. In order to decrease the coating amount of the coating solution, it is required for the coating solution discharged onto the substrate to be leveled more efficiently.

BRIEF SUMMARY OF THE INVENTION

According to a first aspect of the present invention, there is provided a method of forming a coating film, comprising: forming a coating solution film on a substrate by discharging a coating solution comprising a coating film-forming material dissolved in a solvent onto the substrate through a nozzle while relatively moving the nozzle and the substrate, the coating solution containing a low vapor pressure solvent having a vapor pressure of less than 1 Torr (133.322 Pa) at room temperature; and removing the solvent contained in the coating solution film.

According to a second aspect of the present invention, there is provided a method of manufacturing a semiconductor device, comprising forming at least one coating film on a semiconductor substrate, wherein the coating film is formed by a method of forming a coating film according to the first aspect of the present invention.

Further, according to a third aspect of the present invention, there is provided a coating solution for forming a coating film by a scan coating method, the coating solution containing a low vapor pressure solvent having a vapor pressure of less than 1 Torr (133.322 Pa) at room temperature.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

Embodiments of the present invention will now be described more in detail.

In forming a coating film according to one embodiment of the present invention, a coating solution is discharged from a nozzle onto a substrate such as a semiconductor substrate while relatively moving the nozzle and the substrate so as to form a continuous coating solution film on the substrate. Then, the solvent contained in the coating solution film is removed.

As a result of extensive research conducted in an attempt to develop a coating film-forming method that permits forming a coating film having a uniform thickness by a scan coating method, the present inventors have found that the uniformity in the thickness of a film formed by a scan coating method may be governed by a solvent dissolving a coating film-forming material in the coating solution. More specifically, it has been found that a solvent of a coating solution used in the conventional spin coating method has an excessively high vapor pressure, that it is difficult to obtain a coating film of a uniform thickness in the case of forming a coating film by the scan coating method using a coating solution prepared by using such a solvent alone, which has an excessively high vapor pressure noted above, and that a solvent used for preparing a coating solution should contain a low vapor pressure solvent having a vapor pressure of less than 1 Torr (133.322 Pa) at room temperature in order to form a uniform coating film by the scan coating method.

Thus, a coating solution used in the scan coating method, according to one embodiment of the present invention, contains a coating film-forming material and a solvent dissolving the coating film-forming material. A coating solution according to one embodiment of the present invention contains a low vapor pressure solvent having a vapor pressure of less than 1 Torr (133.322 Pa) at room temperature (20° C.). The low vapor pressure solvent preferably has 5 to 14 carbon atoms per molecule, and more preferably has a boiling point of 200° C. to 300° C. under atmospheric pressure (760 mmHg=1.01325×10$^5$ Pa). Where the boiling point fails to fall within the range noted above, the leveling properties of a resultant coating film may tend to be rendered poor.

Examples of such a low vapor pressure solvent include monohydric alcohols such as n-decanol, sec-undecyl alcohol, trimethylnonyl alcohol, sec-tetradecyl alcohol, and sec-heptadecyl alcohol; dihydric alcohols such as hexanediol-2,5, heptanediol-2,4, 2-ethylhexanediol-1,3, diethylene glycol, dipropylene glycol, triethylene glycol, and tripropylene glycol; alkylene glycol monoalkyl ether such as diethylene glycol monobutyl ether, diethylene glycol monohexyl ether, dipropylene glycol monopropyl ether, dipropylene glycol monobutyl ether, triethylene glycol monomethyl ether, triethylene glycol monoethyl ether, triethylene glycol rnonopropyl ether, triethylene glycol monobutyl ether, tripropylene glycol monomethyl ether, tripropylene glycol monoethyl ether, tripropylene glycol monopropyl ether, and tripropylene glycol monobutyl ether; glycol acetate esters such as dipropylene glycol monomethyl ether acetate, dipropylene glycol monoethyl ether acetate, glycol diacetate, and methoxy triglycol acetate; and alkylene glycol dialkyl ethers such as diethylene glycol dibutyl ether, dipropylene glycol dimethyl ether, dipropylene glycol diethyl ether, dipropylene glycol dipropyl ether, dipropylene glycol dibutyl ether, triethylene glycol dimethyl ether, triethylene glycol diethyl ether, triethylene glycol dipropyl ether, triethylene glycol dibutyl ether, tripropylene glycol dimethyl ether, and tripropylene glycol diethyl ether. These low vapor pressure solvents can be used singly or in the form of a mixture of two or more of these low vapor pressure solvents.

In one embodiment of the present invention, it is particularly preferred that the low vapor pressure solvent have at least one hydroxyl group per molecule.

In order to obtain a coating film having a more uniform thickness by the scan coating method, it is preferred that the coating solution used contain the low vapor pressure solvent in an amount of at least 3% by weight. In one embodiment of the present invention, the coating solution can contain up to 99% by weight of the low vapor pressure solvent. Further, the coating solution preferably contains the low vapor pressure solvent in an amount of 5 to 50% by weight.

A coating solution used in one embodiment of the present invention may contain an additional solvent in addition to the low vapor pressure solvent noted above, i.e., an additional solvent having a vapor pressure not lower than 1 Torr (133.322 Pa). Such an additional solvent includes, for example, alcohol solvents, ketone solvents, amide solvents and/or ester solvents.

More specifically, the alcohol solvents used as the additional solvent include, for example, monohydric alcohol solvents such as methanol, ethanol, n-propanol, i-propanol, n-butanol, i-butanol, sec-butanol, tert-butanol, n-pentanol, i-pentanol, 2-methylbutanol, sec-pentanol, tert-pentanol, 3-methoxybutanol, n-hexanol, 2-methylpentanol, sec-hexanol, 2-ethylbutanol, sec-heptanol, heptanol-3, n-octanol, 2-ethylhexanol, sec-octanol, n-nonyl alcohol, 2,6-dimethylheptanol-4, phenol, cyclohexanol, methylcyclohexanol, 3,3,5-trimethylcyclohexanol, benzyl alcohol, and diacetone alcohol; polyhydric alcohol solvents such as ethylene glycol, 1,2-propylene glycol, 1,3-butylene glycol, pentanediol-2,4, and 2-methylpentanediol-2,4; and polyhydric alcohol partial ether solvents such as ethylene glycol monomethyl ether, ethylene glycol monoethyl ether, ethylene glycol monopropyl ether, ethylene glycol monobutyl ether, ethylene glycol monohexyl ether, ethylene glycol monophenyl ether, ethylene glycol mono-2-ethylbutyl ether, diethylene glycol monomethyl ether, diethylene glycol monoethyl ether, diethylene glycol monopropyl ether, propylene glycol monomethyl ether, propylene glycol monoethyl ether, propylene glycol monopropyl ether, propylene glycol monobutyl ether, dipropylene glycol monomethyl ether, and dipropylene glycol monoethyl ether.

The ketone solvents used as the additional solvent include, for example, acetone, methyl ethyl ketone, methyl n-propyl ketone, methyl n-butyl ketone, diethyl ketone, methyl i-butyl ketone, methyl n-pentyl ketone, ethyl n-butyl ketone, methyl n-hexyl ketone, di-i-butyl ketone, trimethylnonanone, cyclohexanone, 2-hexanone, methylcyclohexanone, acetonyl acetone, acetophenone, and fenchone, as well as β-diketones such as acetyl acetone (2,4-pentanedione), 2,4-hexanedione, 2,4-heptanedione, 3,5-heptanedione, 2,4-octanedione, 3,5-octanedione, 2,4-nonanedione, 3,5-nonanedione, 5-methyl-2,4-hexanedione, 2,2,6,6-tetramethyl-3,5-heptanedione, 1,1,1,5,5,5-hexafluoro-2,4-heptanedione.

The amide solvents used as the additional solvent include, for example, formamide, N-methylformamide, N,N-dimethylformamide, N-ethylformamide, N,N-diethylformamide, acetamide, N-methylacetamide, N,N-dimethylacetamide, N-ethylacetamide, N,N-diethylacetamide, N-methylpropionamide, N-methylpyrrolidone, N-formylmorpholine, N-formylpiperidine, N-formylpyrrolidine, N-acetylmorpholine, N-acetylpiperidine, and N-acetylpyrrolidine.

The ester solvents used as the additional solvent include, for example, diethyl carbonate, ethylene carbonate, propylene carbonate, diethyl carbonate, methyl acetate, ethyl acetate, γ-butyrolactone, γ-valerolactone, n-propyl acetate, i-propyl acetate, n-butyl acetate, i-butyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, ethyl propionate, n-butyl propionate, I-amyl propionate, diethyl oxalate, di-n-butyl oxalate, methyl lactate, ethyl lactate, n-butyl lactate, n-amyl lactate, diethyl malonate, dimethyl phthalate and diethyl phthalate.

These additional solvents can be used singly or in the form of a mixture of at least two of these solvents.

In one embodiment of the present invention, the low vapor pressure solvent constitutes, preferably, 3 to 100% by weight, and more preferably, 5 to 50% by weight of the total amount of the solvents contained in the coating solution. It follows that the additional solvents is contained in an amount of, preferably 97 to 0% by weight, and more preferably 50 to 95% by weight, based on the total amount of the solvents contained in the coating solution. A reason why the additional solvent is more preferably contained in an amount of 50 to 95% by weight as noted above is that if the low vapor pressure solvent alone is used, it may be difficult to sufficiently evaporate the solvent from the coating solution film formed on the substrate, which may prolong the process of removing the solvent.

The coating film-forming material that is dissolved in the solvent so as to form the coating solution is not particularly limited, and any kind of coating film-forming material may be used. Particularly, the coating film-forming material used in the manufacture of a semiconductor device includes, for example, a coating film-forming material for forming a silica-based insulating film used as an interlayer insulating film, a coating film-forming material for forming a strontium-bismuth-tantalum oxide film (a so-called "SBT" film), a coating film-forming material providing an organic insulating film such as polyimide or polyarylene ether, and a coating film-forming material providing a resist film. Among these materials, the coating film-forming material that forms a silica-based insulating film includes, for example, a hydrolyzed condensate of an organic silane compound. The coating film-forming material that forms the SBT film contains, as main components, the alkoxides of strontium, bismuth and tantalum. The coating film-forming material providing organic insulating films such as a polyimide film may comprise an organic insulating film material itself such as a polyimide itself. Further, the coating film-forming material providing a resist film may comprise the resist material itself.

The coating film-forming material, which forms a silica-based insulating film, preferably includes a hydrolyzed condensate prepared by hydrolyzing and condensing organic silane compounds represented by formula (1) given below, organic silane compounds represented by formula (2) given below, and/or organic silane compounds represented by formula (3) given below in the presence of a catalyst. As a coating film-forming material that forms a silica-based insulating material, a material is preferred that forms an insulating material exhibiting a relative dielectric constant of 3.3 or less after baking.

$$R_a Si(OR^1)_{4-a} \quad (1)$$

where R is a hydrogen atom, a fluorine atom or a monovalent organic group, $R^1$ is a monovalent organic group, and a is 1 or 2;

$$Si(OR^2)_4 \quad (2)$$

where $R^2$ is a monovalent organic group;

(3)

where each of $R^3$ to $R^6$, which are the same or different, represents a monovalent organic group, each of b and c, which are the same or different, is an integer of 0 to 2, $R^7$ is an oxygen atom, a phenylene group or a group represented by $-(CH_2)_n-$, n is an integer of 1 to 6, and d is 0 or 1.

In each of formulas (1) to (3) given above, the monovalent organic group includes, for example, an aliphatic or aromatic hydrocarbon group, an amino-substituted hydrocarbon group or an epoxy group. More specifically, the monovalent organic group includes, for example, a $C_1$–$C_4$ alkyl group such as a methyl group, an ethyl group, a propyl group and a butyl group, a vinyl group, a phenyl group, an amino $C_1$–$C_4$ alkyl group, and a glycidyl group.

Examples of the compound represented by formula (1) include, for example, tri(hydroxy organo) silanes such as trimethoxysilane, triethoxysilane, tri-n-propoxysilane, tri-iso-propoxysilane, tri-n-butoxysilane, tri-sec-butoxysilane, tri-tert-butoxysilane, triphenoxysilane, fluorotrimethoxysilane, fluorotriethoxysilane, fluorotri-n-propoxysilane, fluorotri-iso-propoxysilane, fluorotri-n-butoxysilane, fluorotri-sec-butoxysilane, fluorotri-tert-butoxysilane, and fluorotriphenoxysilane; monoorgano tri (hydroxy organo) silanes such methyltrimethoxysilane, methyltriethoxysilane, methyltri-n-propoxysilane, methyltri-iso-propoxysilane, methyltri-n-butoxysilane, methyltri-sec-butoxysilane, methyltri-tert-butoxysilane, methyltriphenoxysilane, ethyltrimethoxysilane, ethyltriethoxysilane, ethyltri-n-propoxysilane, ethyltri-iso-propoxysilane, ethyltri-n-butoxysilane, ethyltri-sec-butoxysilane, ethyltri-tert-butoxysilane, ethyltriphenoxysilane, vinyltrimethoxysilane, vinyltriethoxysilane, vinyltri-n-propoxysilane, vinyltri-iso-propoxysilane, vinyltri-n-butoxysilane, vinyltri-sec-butoxysilane, vinyltri-tert-butoxysilane, vinyltriphenoxysilane, n-propyltrimethoxysilane, n-propyltriethoxysilane, n-propyltri-n-propoxysilane, n-propyltri-iso-propoxysilane, n-propyltri-n-butoxysilane, n-propyltri-sec-butoxysilane, n-propyltri-tert-butoxysilane, n-propyltriphenoxysilane, i-propyltrimethoxysilane, I-propyltriethoxysilane, i-propyltri-n-propoxysilane, i-propyltri-iso-propoxysilane, I-propyltri-n-butoxysilane, I-propyltri-sec-butoxysilane, I-propyltri-tert-butoxysilane, I-propyltriphenoxysilane, n-butyltrimethoxysilane, n-butyltriethoxysilane, n-butyltri-n-propoxysilane, n-butyltri-iso-propoxysilane, n-butyltri-n-butoxysilane, n-butyltri-sec-butoxysilane, n-butyltri-tert-butoxysilane, n-butyltriphenoxysilane, sec-butyltrimethoxysilane, sec-butyltriethoxysilane, sec-butyltri-n-propoxysilane, sec-butyltri-iso-propoxysilane, sec-butyltri-n-butoxysilane, sec-butyltri-sec-butoxysilane, sec-butyltri-tert-butoxysilane, sec-butyltriphenoxysilane, t-butyltrimethoxysilane, t-butyltriethoxysilane, t-butyltri-n-propoxysilane, t-butyltri-iso-propoxysilane, t-butyltri-n-butoxysilane, t-butyltri-sec-butoxysilane, t-butyltri-tert-butoxysilane, t-butyltriphenoxysilane, phenyltrimethoxysilane, phenyltriethoxysilane, phenyltri-n-propoxysilane, phenyltri-iso-propoxysilane, phenyltri-n-butoxysilane, phenyltri-sec-butoxysilane, phenyltri-tert-butoxysilane, phenyltriphenoxysilane, vinyltrimethoxysilane, vinyltriethoxysilane, γ-aminopropyltrimethoxysilane, γ-aminopropyltriethoxysilane, γ-glycidoxypropyltrimethoxysilane, γ-glycidoxypropyltriethoxysilane, γ-trifluoropropyltrimethoxysilane, and γ-trifluoropropyltriethoxysilane; and diorgano di(hydroxy organo) silanes such as dimethyldimethoxysilane, dimethyldiethoxysilane, dimethyl-di-n-propoxysilane, dimethyldi-iso-propoxysilane, dimethyldi-n-butoxysilane, dimethyldi-sec-butoxysilane, dimethyldi-t ert-butoxysilane, dimethyldiphenoxysilane, diethyldimethoxysilane, diethyldiethoxysilane, diethyldi-n-propoxysilane, diethyldi-iso-propoxysilane, diethyldi-n-butoxysilane, diethyldi-sec-butoxysilane, diethyldi-tert-butoxysilane, diethyldiphenoxysilane, di-n-propyldimethoxysilane, di-n-propyldiethoxysilane, di-n-propyldi-n-propoxysilane, di-n-propyldi-iso-propoxysilane, di-n-propyldi-n-butoxysilane, di-n-propyldi-sec-butoxysilane, di-n-propyldi-tert-butoxysilane, di-n-propyldiphenoxysilane, di-iso-propyldimethoxysilane, di-iso-propyldiethoxysilane, di-iso-propyldi-n-propoxysilane, di-iso-propyldi-iso-propoxysilane, di-iso-propyldi-n-butoxysilane, di-iso-propyldi-sec-butoxysilane, di-iso-propyldi-tert-butoxysilane, di-iso-propyldiphenoxysilane, di-n-butyldimethoxysilane, di-n-butyldiethoxysilane, di-n-butyldi-n-propoxysilane, di-n-butyldi-iso-propoxysilane, di-n-butyldi-n-butoxysilane, di-n-butyldi-sec-butoxysilane, di-n-butyldi-tert-butoxysilane, di-n-butyldiphenoxysilane, di-sec-butyldimethoxysilane, di-sec-butyldiethoxysilane, di-sec-butyldi-n-propoxysilane, di-sec-butyldi-iso-propoxysilane, di-sec-butyldi-ni-butoxysilane, di-sec-butyldi-sec-butoxysilane, di-sec-butyldi-tert-butoxysilane, di-sec-butyldiphenoxysilane, di-tert-butyldimethoxysilane, di-tert-butyldiethoxysilane, di-tert-butyldi-n-propoxysilane, di-tert-butyldi-iso-propoxysilane, di-tert-butyldi-n-butoxysilane, di-tert-butyldi-sec-butoxysilane, di-tert-butyldi-tert-butoxysilane, di-tert-butyldiphenoxysilane, diphenyldimethoxysilane, diphenyldiethoxysilane, diphenyldi-n-propoxysilane, diphenyldi-iso-propoxysilane, diphenyldi-n-butoxysilane, diphenyldi-sec-butoxysilane, diphenyldi-tert-butoxysilane, diphenyldiphenoxysilane, and divinyltrimethoxysilane. These compounds can be used singly or in the form of a mixture of at least two of these compounds.

Preferred examples of the compound represented by formula (1) include, for example, methyltrimethoxysilane, methyltriethoxysilane, methyltri-n-propoxysilane, methyltri-iso-propoxysilane, ethyltrimethoxysilane, ethyltriethoxysilane, vinyltrimethoxysilane, vinyltriethoxysilane, phenyltrimethoxysilane, phenyltriethoxysilane, dimethyldimethoxysilane, dimethyldiethoxysilane, diethyldimethoxysilane, diethyldiethoxysilane, diphenyldimethoxysilane, and diphenyldiethoxysilane.

Examples of the compound represented by formula (2) include, for example, tetramethoxysilane, tetraethoxysilane, tetra-n-propoxysilane, tetra-iso-propoxysilane, tetra-n-butoxysilane, tetra-sec-butoxysilane, tetra-tert-butoxysilane and tetraphenoxysilane.

Examples of the compound represented by formula (3), in which $R^7$ represents an oxygen atom, include, for example, hexamethoxydisiloxane, hexaethoxydisiloxane, hexaphenoxydisiloxane, 1,1,1,3,3-pentamethoxy-3-methyldisiloxane, 1,1,1,3,3-pentaethoxy-3-methyldisiloxane, 1,1,1,3,3-pentaphenoxy-3-methyldisiloxane, 1,1,1,3,3-pentamethoxy-3-ethyldisiloxane, 1,1,1,3,3-pentaethoxy-3-ethyldisiloxane, 1,1,1,3,3-pentaphenoxy-3-ethyldisiloxane, 1,1,1,3,3-pentamethoxy-3-phenyldisiloxane, 1,1,1,3,3-pentaethoxy-3-phenyldisiloxane, 1,1,1,3,3-pentaphenoxy-3-phenyldisiloxane, 1,1,3,3-tetramethoxy-1,3-dimethyldisiloxane, 1,1,3,3-tetraethoxy-1,3-dimethyldisiloxane, 1,1,3,3-tetraphenoxy-1,3-dimethyldisiloxane, 1,1,3,3-tetramethoxy-1,3-diethyldisiloxane, 1,1,3,3-tetraethoxy-1,3-diethyldisiloxane, 1,1,3,3-tetraphenoxy-1,3-diethyldisiloxane, 1,1,3,3-tetramethoxy-1,3-diphenyldisiloxane, 1,1,3,3-tetraethoxy-1,3-diphenyldisiloxane, 1,1,3,3-tetraphenoxy-1,3-diphenyldisiloxane, 1,1,3-trimethoxy-1,3,3-trimnethyldisiloxane, 1,1,3-triethoxy-1,3,3-trimethyldisiloxane, 1,1,3-triphenoxy-1,3,3-trimethyldisiloxane, 1,1,3-trimethoxy-1,3,3-triethyldisiloxane, 1,1,3-triethoxy-1,3,3-triethyldisiloxane, 1,1,3-triphenoxy-1,3,3-triethyldisiloxane, 1,1,3-trimethoxy-1,3,3-triphenyldisiloxane, 1,1,3-triethoxy-1,3,3-triphenyldisiloxane, 1,1,3-triphenoxy-1,3,3-triphenyldisiloxane, 1,3-dimethoxy-1,1,3,3-tetramethyldisiloxane, 1,3-diethoxy-1,1,3,3-tetramethyldisiloxane, 1,3-diphenoxy-1,1,3,3-tetramethyldisiloxane, 1,3-dimethoxy-1,1,3,3-tetraethyldisiloxane, 1,3-diethoxy-1,1,3,3-tetraethyldisiloxane, 1,3-diphenoxy-1,1,3,3-tetraethyldisiloxane, 1,3-dimethoxy-1,1,3,3-tetraphenyldisiloxane, 1,3-diethoxy-1,1,3,3-tetraphenyldisiloxane, and 1,3-diphenoxy-1,1,3,3-tetraphenyldisiloxane. These compounds can be used singly or in the form of a mixture of at least two of these compounds.

The preferred compounds represented by formula (3), in which $R^7$ represents an oxygen atom, include, for example, hexamethoxydisiloxane, hexaethoxydisiloxane, 1,1,3,3-tetramethoxy-1,3-dimethyldisiloxane, 1,1,3,3-tetraethoxy-1,3-dimethyldisiloxane, 1,1,3,3-tetramethoxy-1,3-diphenyldisiloxane, 1,3-dimethoxy-1,1,3,3-tetramethyldisiloxane, 1,3-diethoxy-1,1,3,3-tetramethyldisiloxane, 1,3-dimethoxy-1,1,3,3-tetraphenyldisiloxane, and 1,3-diethoxy-1,1,3,3-tetraphenyldisiloxane.

Examples of the compound represented by formula (3), in which d is 0, include, for example, hexamethoxydisilane, hexaethoxydisilane, hexaphenoxydisilane, 1,1,1,2,2-pentamethoxy-2-methyldisilane, 1,1,1,2,2-pentaethoxy-2-methyldisilane, 1,1,1,2,2-pentaphenoxy-2-methyldisilane, 1,1,1,2,2-pentamethoxy-2-ethyldisilane, 1,1,1,2,2-pentaethoxy-2-ethyldisilane, 1,1,1,2,2-pentaphenoxy-2-ethyldisilane, 1,1,1,2,2-pentamethoxy-2-phenyldisilane, 1,1,1,2,2-pentaethoxy-2-phenyldisilane, 1,1,1,2,2-pentaphenoxy-2-phenyldisilane, 1,1,2,2-tetramethoxy-1,2-dimethyldisilane, 1,1,2,2-tetraethoxy-1,2-dimethyldisilane, 1,1,2,2-tetraphenoxy-1,2-dimethyldisilane, 1,1,2,2-tetramethoxy-1,2-diethyldisilane, 1,1,2,2-tetraethoxy-1,2-diethyldisilane, 1,1,2,2-tetraphenoxy-1,2-diethyldisilane, 1,1,2,2-tetramethoxy-1,2-diphenyldisilane, 1,1,2,2-tetraethoxy-1,2-diphenyldisilane, 1,1,2,2-tetraphenoxy-1,2-diphenyldisilane, 1,1,2-trimethoxy-1,2,2-trimethyldisilane, 1,1,2-triethoxy-1,2,2-trimethyldisilane, 1,1,2-triphenoxy-1,2,2-trimethyldisilane, 1,1,2-trimethoxy-1,2,2-triethyldisilane, 1,1,2-triethoxy-1,2,2-triethyldisilane, 1,1,2-triphenoxy-1,2,2-triethyldisilane, 1,1,2-trimethoxy-1,2,2-triphenyldisilane, 1,1,2-triethoxy-1,2,2-triphenyldisilane, 1,1,2-triphenoxy-1,2,2-triphenyldisilane, 1,2-dimethoxy-1,1,2,2-tetramethyldisilane, 1,2-diethoxy-1,1,2,2-tetramethyldisilane, 1,2-diphenoxy-1,1,2,2-tetramethyldisilane, 1,2-dimethoxy-1,1,2,2- tetraethyldisilane, 1,2-diethoxy-1,1,2,2-tetraethyldisilane, 1,2-diphenoxy-1,1,2,2-tetraethyldisilane, 1,2-dimethoxy-1,1,2,2-tetraphenyldisilane, 1,2-diethoxy-1,1,2,2-tetraphenyldisilane, and 1,2-diphenoxy-1,1,2,2-tetraphenyldisilane. These compounds can be used. singly or in the form of a mixture of at least two of these compounds.

Preferred examples of the compound represented by formula (3), in which d is 0, include, for example, hexamethoxydisilane, hexaethoxydisilane, 1,1,2,2-tetramethoxy-1,2-dimethyldisilane, 1,1,2,2-tetraethoxy-1,2-dimethyldisilane, 1,1,2,2-tetramethoxy-1,2-diphenyldisilane, 1,2-dimethoxy-1,1,2,2-tetramethyldisilane, 1,2-diethoxy-1,1,2,2-tetramethyldisilane, 1,2-dimethoxy-1,1,2,2-tetraphenyldisilane, and 1,2-diethoxy-1,1,2,2-tetraphenyldisilane.

Further, examples of the compound represented by formula (3), in which $R^7$ is represented by —$(CH_2)_n$—, include, for example, bis(trimethoxysilyl)methane, bis(triethoxysilyl)methane, bis(tri-n-propoxysilyl)methane, bis(tri-I-propoxysilyl)methane, bis(tri-n-butoxysilyl)methane, bis(tri-sec-butoxysilyl)methane, bis(tri-tert-butoxysilyl)methane, 1,2-bis(trimethoxysilyl)ethane, 1,2-bis(triethoxysilyl)ethane, 1,2-bis(tri-n-propoxysilyl)ethane, 1,2-bis(tri-I-propoxysilyl)ethane, 1,2-bis(tri-n-butoxysilyl)ethane, 1,2-bis(tri-sec-butoxysilyl)ethane, 1,2-bis(tri-tert-butoxysilyl)ethane, 1-(dimethoxy methyl silyl)-1-(trimethoxysilyl)methane, 1-(diethoxy methyl silyl)-1-(triethoxysilyl)methane, 1-(di-n-propoxy methyl silyl)-1-(tri-n-propoxysilyl)methane, 1-(di-i-propoxy methyl silyl)-1-(tri-i-propoxysilyl)methane, 1-(di-n-butoxy methyl silyl)-1-(tri-n-butoxysilyl)methane, 1-(di-sec-butoxy methyl silyl)-1-(tri-sec-butoxysilyl)methane, 1-(di-tertbutoxy methyl silyl)-1-(tri-tert-butoxysilyl)methane, 1-(dimethoxy methyl silyl)-2-(trimethoxysilyl)ethane, 1-(diethoxy methyl silyl)-2-(triethoxysilyl)ethane, 1-(di-n-propoxy methyl silyl)-2-(tri-n-propoxysilyl)ethane, 1-(di-i-propoxy methyl silyl)-2-(tri-i-propoxysilyl)ethane, 1-(di-n-butoxy methylsilyl)-2-(tri-n-butoxysilyl)ethane, 1-(di-sec-butoxy methyl silyl)-2-(tri-sec-butoxysilyl)ethane, 1-(di-tert-butoxy methyl silyl)-2-(tri-tert-butoxysilyl)ethane, bis(dimethoxy methyl silyl)methane, bis(diethoxy methyl silyl)methane, bis(di-n-propoxy methyl silyl)methane, bis(di-I-propoxy methyl silyl)methane, bis(di-n-butoxy methyl silyl)methane, bis(di-sec-butoxy methyl silyl)methane, bis(di-tert-butoxy methyl silyl)methane, 1,2-bis(dimethoxy methyl silyl) ethane, 1,2-bis(diethoxy methyl silyl)ethane, 1,2-bis(di-n-propoxy methyl silyl)ethane, 1,2-bis(di-i-propoxy methyl silyl)ethane, 1,2-bis(di-n-butoxy methyl silyl)ethane, 1,2-bis(di-sec-butoxy methyl silyl)ethane, 1,2-bis(di-tert-butoxy methyl silyl)ethane, 1,2-bis(trimethoxysilyl)benzene, 1,2-bis(triethoxysilyl)benzene, 1,2-bis(tri-n-propoxysilyl) benzene, 1,2-bis(tri-I-propoxysilyl)benzene, 1,2-bis(tri-n-butoxysilyl)benzene, 1,2-bis(tri-sec-butoxysilyl)benzene, 1,2-bis(tri-t-butoxysilyl)benzene, 1,3-bis(trimethoxysilyl)benzene, 1,3-bis(triethoxysilyl)benzene, 1,3-bis(tri-n-propoxysilyl)benzene, 1,3-bis(tri-I-propoxysilyl)benzene, 1,3-bis(tri-n-butoxysilyl)benzene, 1,3-bis(tri-sec-butoxysilyl)benzene, 1,3-bis(tri-tert-butoxysilyl)benzene, 1,4-bis(trimethoxysilyl)benzene, 1,4-bis(trimethoxysilyl) benzene, 1,4-bis(tri-n-propoxysilyl)benzene, 1,4-bis(tri-I-propoxysilyl)benzene, 1,4-bis(tri-n-butoxysilyl)benzene, 1,4-bis(tri-sec-butoxysilyl)benzene, and 1,4-bis(tri-tert-butoxysilyl)benzene. These compounds can be used singly or in the form of a mixture of at least two of these compounds.

Preferred examples of the compound represented by formula (3), in which $R^7$ is represented by —$(CH_2)_n$—, include, for example, bis(trimethoxysilyl)methane, bis(triethoxysilyl)methane, 1,2-bis(trimethoxysilyl)ethane, 1,2-bis(triethoxysilyl)ethane, 1-(dimethoxy methyl silyl)-1-(trimethoxysilyl)methane, 1-(diethoxy methyl silyl)-1-(triethoxysilyl)methane, 1-(dimethoxy methyl silyl)-2-(trimethoxysilyl)ethane, 1-(diethoxy methyl silyl)-2-(triethoxysilyl)ethane, bis(dimethoxy methyl silyl)methane, bis(diethoxy methyl silyl)methane, 1,2-bis(dimethoxy methyl silyl)ethane, 1,2-bis(diethoxy methyl silyl)ethane, 1,2-bis(trimethoxysilyl)benzene, 1,2-bis(triethoxysilyl) benzene, 1,3-bis(trimethoxysilyl)benzene, 1,3-bis (triethoxysilyl)benzene, 1,4-bis(trimethoxysilyl)benzene, and 1,4-bis(triethoxysilyl)benzene.

In hydrolyzing and condensing at least one silane compound represented by any of formulas (1) to (3), it is desirable to use water in an amount exceeding 0.5 mole and not exceeding 150 moles, more desirably in an amount exceeding 0.5 mole and not exceeding 130 moles, per mole of the sum of the compounds represented by formulas (1) to (3). If water is added in an amount not exceeding 0.5 mole, the formed coating film may be poor in the resistance to cracks. On the other hand, if water is added in an amount exceeding 150 moles, the polymer may be precipitated or gelled during the hydrolysis/condensation reaction in some cases. An organic solvent can be used in addition to water for the hydrolysis/condensation reaction. As such an organic solvent, use may be made of a solvent that can be used for preparing the coating solution described previously. Of the solvents used for the hydrolysis/condensation reaction of the silane compounds, preferred as the alcohol solvent are methanol, ethanol, n-propanol, i-propanol, n-butanol, i-butanol, sec-butanol, t-butanol, n-pentanol, I-pentanol, 2-methylbutanol, sec-pentanol, t-pentanol, 3-methoxybutanol, n-hexanol, 2-methylpentanol, sec-hexanol, 2-ethylbutanol, ethylene glycol monomethyl ether, ethylene glycol monoethyl ether, ethylene glycol monopropyl ether, ethylene glycol monobutyl ether, propylene glycol monomethyl ether, propylene glycol monoethyl ether, propylene glycol monopropyl ether, propylene glycol monobutyl ether, dipropylene glycol monomethyl ether, dipropylene glycol monoethyl ether, and dipropylene glycol moncpropyl ether.

It is desirable to use a catalyst in the hydrolysis/condensation reaction of at least one silane compound represented by any of formulas (1) to (3).

Such a catalyst includes a metal chelate compound, an acid catalyst and an alkali catalyst.

Examples of the metal chelate compound include, for example, titanium chelate compounds such as triethoxy mono(acetylacetonato)titanium, tri-n-propoxy mono (acetylacetonato) titanium, tri-ii-propoxy mono (acetylacetonato)titanium, tri-n-butoxy mono (acetylacetonato)titanium, tri-sec-butoxy mono (acetylacetonato) titanium, tri-tert-butoxymono (acetylacetonato)titanium, diethoxy bis(acetylacetonato) titanium, di-n-propoxy bis(acetylacetonato)titanium, di-i-propoxy bis(acetylacetonato)titanium, di-n-butoxy bis (acetylacetonato)titanium, di-sec-butoxy bis (acetylacetonato)titanium, di-tert-butoxy bis (acetylacetonato)titanium, monoethoxy tris(acetylacetonato) titanium, mono-n-propoxy tris(acetylacetonato)titanium, mono-i-propoxy tris(acetylacetonato)titanium, mono-n-butoxy tris(acetylacetonato)titanium, mono-sec-butoxytris (acetylacetonato)titanium, mono-tert-butoxy tris (acetylacetonato)titanium, tetrakis(acetylacetonato) titanium, triethoxy mono(ethyl acetoacetato)titanium, tri-n-propoxy mono(ethyl acetoacetato)titanium, tri-i-propoxy mono(ethyl acetoacetato)titanium, tri-n-butoxy mono(ethyl acetoacetato)titanium, tri-sec-butoxy mono(ethyl acetoacetato)titanium, tri-tert-butoxymono(ethyl acetoacetato)titanium, diethoxy bis(ethyl acetoacetato)titanium, di-n-propoxy bis(ethyl acetoacetato)titanium, (di-i-propoxy bis(ethylacetoacetato)titanium, di-n-butoxy bis(ethyl acetoacetato)titanium, di-sec-butoxy bis(ethylacetoacetato)titanium, di-tert-butoxy bis(ethyl acetoacetato)titanium, monoethoxy tris(ethyl acetoacetato) titanium, mono-n-propoxy tris(ethyl acetoacetato)titanium, mono-i-propoxy tris(ethyl acetoacetato)titanium, mono-n-butoxy tris(ethyl acetoacetato)titanium, mono-sec-butoxy tris(ethyl acetoacetato)titanium, mono-tert-butoxy tris(ethyl acetoacetato)titanium, tetrakis (ethylacetoacetato)titanium, mono-(aetylacetonato) tris(ethyl acetoacetato)titanium, bis (acetylacetonato) bis(ethyl acetoacetato)titanium, and tris (acetylacetonato) mono(ethyl acetate)titanium; zirconium chelate compounds such as triethoxy mono(acetylacetonato) zirconium, tri-n-propoxy mono(acetylacetonato)zirconium, tri-i-propoxy mono(acetylacetonato)zirconium, tri-n-butoxy mono(acetylacetonato)zirconium, tri-sec-butoxy mono (acetylacetonato)zirconium, tri-tert-butoxy mono (acetylacetonato)zirconium, diethoxy bis(acetylacetonato) zirconium, di-n-propoxy bis(acetylacetonato)zirconium, di-i-propoxy bis(acetylacetonato)zirconium, di-n-butoxy bis (acetylacetonato)zirconium, di-sec-butoxy bis (acetylacetonato)zirconium, di-tert-butoxy bis (acetylacetonato)zirconium, monoethoxy tris (acetylacetonato)zirconium, mono-n-propoxy tris (acetylacetonato)zirconium, mono-i-propoxy tris (acetylacetonato)zirconium, mono-n-butoxy tris (acetylacetonato)zirconium, mono-sec-butoxy tris (acetylacetonato)zirconium, mono-tert-butoxy tris (acetylacetonato)zirconium, tetrakis(acetylacetonato) zirconium, triethoxy mono(ethyl acetoacetato)zirconium, tri-n-propoxy mono(ethyl acetoacetato)zirconium, tri-i-propoxy mono(ethyl acetoacetato)zirconium, tri-n-butoxy mono(ethyl acetoacetato)zirconium, tri-sec-butoxy mono (ethyl acetoacetato)zirconium, tri-tert-butoxy mono(ethyl acetoacetato)zirconium, diethoxy bis(ethyl acetoacetato) zirconium, di-n-propoxy bis(ethyl acetoacetato)zirconium, di-i-propoxy bis(ethyl acetoacetato)zirconium, di-n-butoxy bis(ethyl acetoacetato)zirconium, di-sec-butoxy bis(ethyl acetoacetato)zirconium, di-tert-butoxy bis(ethyl acetoacetato)zirconium, monoethoxy tris(ethyl acetoacetato)zirconium, mono-n-propoxy tris(ethyl acetoacetato)zirconium, mono-i-propoxy tris(ethyl acetoacetato)zirconium, mono-n-butoxy tris(ethyl acetoacetato)zirconium, mono-sec-butoxy tris(ethyl acetoacetato)zirconium, mono-tert-butoxy tris(ethyl acetoacetato)zirconium, tetrakis(ethyl acetoacetato) zirconium mono (acetylacetonato) tris(ethyl acetoacetato) zirconium, bis(acetylacetonato) bis(ethyl acetoacetato) zirconium, and tris(acetylacetonato) mono(ethyl acetoacetato)zirconium; and aluminum chelate compounds such as tris(acetylacetonato)aluminum and tris(ethyl acetoacetato)aluminum. These metal chelate compounds can be used singly or in the form of a mixture of at least two of these metal chelate compounds. Among these metal chelate compounds, chelate compounds of titanium and/or aluminum are preferred, with titanium chelate compounds being particularly preferred.

Examples of the acid catalyst include, for example, inorganic acids such as hydrochloric acid, nitric acid, sulfuric acid, hydrofluoric acid, and phosphoric acid; and organic acids such as acetic acid, propionic acid, butanoic acid, pentanoic acid, hexanoic acid, heptanoic acid, octanoic acid, nonanoic acid, decanoic acid, oxalic acid, maleic acid, methylmalonic acid, adipic acid, sebacic acid, gallic acid, butyric acid, mellitic acid, arachidonic acid, shikimic acid, 2-ethylhexanoic acid, oleic acid, stearic acid, linoleic acid, linolenic acid, salicylic acid, benzoic acid, p-aminobenzoic acid, p-toluenesulfonic acid, benzenesulfonic acid, monochloroacetic acid, dichloroacetic acid, trichlc,roacetic acid, trifluoroacetic acid, formic acid, malonic acid, sulfonic acid, phthalic acid, fumaric acid, citric acid, tartaric acid, succinic acid, itaconic acid, mesaconic acid, citraconic acid, malic acid, hydrolyzate of glutaric acid, hydrolyzate of maleic anhydride, and hydrolyzate of phthalic anhydride. These acid catalysts can be used singly or in the form of a mixture of at least two of these catalysts. Among these acid catalysts, the organic acids are more preferred.

Examples of the alkali catalyst include, for example, sodium hydroxide, potassium hydroxide, lithium hydroxide, pyridine, pyrrol, piperazine, pyrrolidine, piperidine, picoline, monoethanolamine, diethanolamine, dimethylmonoethanolamine, monomethyldiethanolamine, triethanolamine, diazabicyclooctane, diazabicycloundecene, tetramethylammonium hydroxide, tetraethylammonium hydroxide, tetrapropylammonium hydroxide, tetrabutylammonium hydroxide, ammonia, methylamine, ethylamine, propylamine, butylamine, pentylamine, hexylamine, octylamine, nonylamine, decylamine, N,N-dimethylamine, N,N-diethylamine, N,N-dipropylamine, N,N-dibutylamine, trimethylamine, triethylamine, tripropylamine, tributylamine, cyclohexylamine, trimethylimidine, 1-amino-3-methylbutane, dimethylglycine, and 3-amino-3-methylamine. These alkali catalysts can be used singly or in the form of a mixture of at least two of these alkali catalysts. Among these alkali catalysts, amines are more preferred, with ammonia, alkylamines and tetralkylammonium hydroxides being particularly preferred in view of the bonding strength of the silica-based film obtained to the substrate.

The catalysts noted above are used in an amount of, generally, 0.00001 to 10 moles, preferably 0.00005 to 5 moles, and more preferably 0.001 to 0.5 mole per mole of the total moles of the $R^1O$— group, $R^2O$— group, $R^4O$— group and $R^5O$— group included in the compounds represented by formulas (1) to (3). If the amount of the catalyst used falls within the range noted above, the polysiloxane polymer is unlikely to be precipitated or gelled during the reaction.

It is preferred that the silane compound represented by formula (2) be contained in an amount of 5 to 75% by weight, more preferably 10 to 70% by weight, and most preferably 15 to 70% by weight, based on the total amount of the silane compounds represented by formulas (1) to (3) in terms of completely hydrolyzed condensate of the compounds of formulas (1) to (3). Needless to say, in this case, the silane compound represented by formula (1) and/or the silane compound represented by formula (3) are contained in an amount of 95 to 25% by weight, preferably 90 to 30% by weight, and most preferably 85 to 30% by weight, based on the total amount of the silane compounds represented by formulas (1) to (3). Where the amount of the silane compound represented by formula (2) constitutes 5 to 75% by weight of the total amount of the silane compounds represented by formulas (1) to (3), the resultant coating film has a high modulus of elasticity and is particularly excellent in its low dielectric properties so as to make it possible to form, after baking, a silica-based insulating material exhibiting a relative dielectric constant of 3.3 or less, for example, as an interlayer dielectric.

A hydrolyzed condensate of a mixture of the silane compound represented by formula (1) and the silane compound represented by formula (3) is preferred because the resultant composition is more excellent in the storage stability.

It is not necessary for all of the $R^1O$— group, the $R^2O$— group, the $R^4O$— group and the $R^5O$— group included in formulas (1) to (3) to be hydrolyzed. For example, it is possible for only one of these groups to be hydrolyzed or for two or more of these groups to be hydrolyzed. Alternatively, it is possible to use a mixture of a hydrolyzate in which one of these groups is hydrolyzed and a hydrolyzate in which a plurality of these groups are hydrolyzed.

The condensate is the compound having a Si—O—Si bond formed therein by condensation of the silanol groups of the hydrolyzates of the silane compounds represented by formulas (1) to (3). However, it is not necessary for all the silanol groups to be condensed. In other words, the condensate includes a compound in which only a very small part of silanol groups are condensed and a mixture of condensates differing from each other in the degree of condensation.

Incidentally, the completely hydrolyzed condensate referred to previously represents the compound in which the $R^1O$— group, the $R^2O$— group, the $R^4O$— group and the $R^5O$— group included in the silane compounds represented by formulas (1) to (3) are hydrolyzed by 100% into the SiOH groups, which are completely condensed to form the siloxane structure.

A concentration of the hydrolyzed condensate, in terms of the completely hydrolyzed condensate, in the reaction solvent is preferably 1 to 20% by weight, preferably 1.5 to 18% by weight.

Also, a temperature at which the hydrolysis/condensation reaction is carried out is generally 0° C. to 100° C., preferably 15° C. to 90° C.

It is preferred that a coating solution used in one embodiment of the present invention contain 50% to 99% by weight, more preferably between 80% to 95% by weight, based on the total amount of the coating solution. A reason why the amount of the solvent is preferably 50% to 99% by weight (hence the solid content of the coating solution is 50% to 1% by weight) is that if the amount of the solid component is smaller than 1% by weight, the amount of the coating solution used is increased and a large amount of the solution is disposed on the substrate, with the result that the flowability of the resultant coating solution is increased, sometimes making it difficult to practically form a uniform film. On the other hand, if the amount of the solid component exceeds 50% by weight, the viscosity of the coating solution is rendered excessively high, resulting in failure to obtain a sufficient flowability of the coating solution, and it may become necessary to decrease the coating amount when a coating film of the same thickness is formed, with the result that the coating solution discharged onto the substrate fails to be leveled sufficiently.

Where the coating solution is discharged, by the scan coating method, through a nozzle onto a substrate in the form of lines such as parallel lines or a spiral line, the discharged liquid lines are required to be leveled on the substrate so as to allow the substrate to be covered with a single continuous coating solution film. Also, where the affinity between the discharged coating solution and the substrate is poor, even after the discharged coating solution has once covered the substrate surface as a single liquid film, the in-plane uniformity of the formed coating film is rendered poor regardless of the form of coating solution discharged. In order to evaluate the affinity between the substrate and the coating solution and the leveling properties of the coating solution on the substrate, a contact angle is generally used as an index. However, since a desirable contact angle of a coating solution used in the scan coating method is small, i.e., 20° or less, in it is difficult to accurately measure the contact angle. Such being the situation, it is practical to employ another method in place of the evaluation by the contact angle. Specifically, it is practical to drip a predetermined amount of the coating solution onto the substrate so as to evaluate the leveling properties of the coating solution on the substrate for evaluating the affinity between the substrate and the coating solution. The present inventors have found that, if the expansion in the diameter of a coating solution droplet on the substrate 3 minutes after the dripping of 5 $\mu$L of the coating solution is not smaller than 5 mm, preferably not smaller than 10 mm, the leveling properties are sufficient and the uniformity is satisfactory when the coating solution film is formed by the scan coating method.

In one embodiment of the present invention, a coating film can be obtained by applying a coating solution onto the substrate by the scan coating method, followed by removing the solvent from the coating solution film. Removal of the solvent from the coating solution can be effected by simply placing the substrate to which is applied the coating solution under a reduced pressure, without heating the substrate. Alternatively, the solvent can be evaporated and removed by a simple heating. Heating can be performed at 50° C. to 350° C., preferably at 80° C. to 200° C., and can be performed on a hot plate. Particularly, where a silica-based insulating film is formed, it is a general practice to bake the coating solution film, from which the solvent has been removed, by heating at 350° C. to 450° C.

A coating apparatus used in a scan coating method that can be employed for forming a coating film by the scan coating method according to one embodiment of the present invention will now be described with reference to FIGS. 1 to 3.

Figure 1:
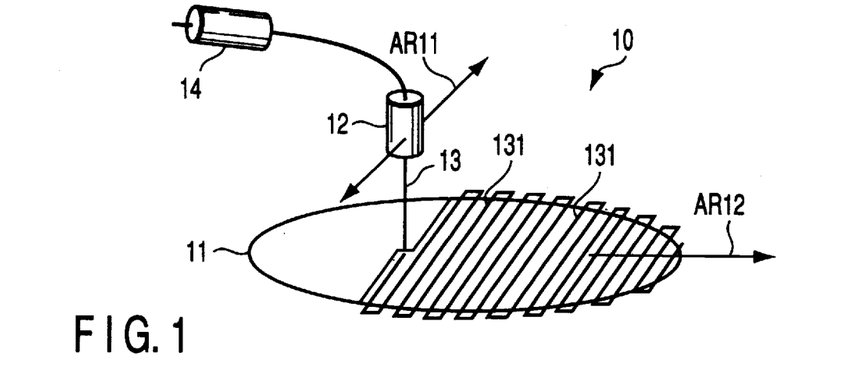
FIG. 1 schematically shows, as an example, a coating apparatus that can be used in a coating film-forming method according to one embodiment of the present invention.

FIG. 1 schematically shows, as an example, a coating apparatus 10 that can be used for forming a coating film by a scan coating method according to one embodiment of the present invention. The coating apparatus 10 shown in FIG. 1 discharges a coating solution onto a substrate 11 in the form of a large number of parallel lines. A nozzle 12 arranged above the substrate 11 and discharging the coating solution as a line 13 is reciprocated in a direction denoted by an arrow AR11. At the same time, the substrate 11 is moved in a direction perpendicular to the direction of the arrow 11 as denoted by another arrow AR12. As a result, a large number of parallel coating solution lines 131 are formed on the substrate 11. The coating solution is supplied from a coating solution container (not shown) into the discharge nozzle 12 by a discharge pump 14. After a large number of parallel coating solution lines 131 are formed over the entire surface of the substrate 11, the discharge of the coating solution from the nozzle 12 is stopped. Usually, the parallel coating solution lines 131 are leveled so as to be joined to each other in about several seconds during which the next liquid line and the liquid line after the next liquid line are being discharged, thereby forming a continuous coating solution film on the substrate 11. However, where the coating solution is poor in the leveling properties and in the affinity with the substrate, a continuous coating solution film can be formed by allowing a large number of parallel coating solution lines 131 formed on the entire surface of the substrate 11 to stand for several seconds to several minutes. After the continuous coating solution film is formed in this way, the next step of removing the solvent is carried out.

Figure 2:
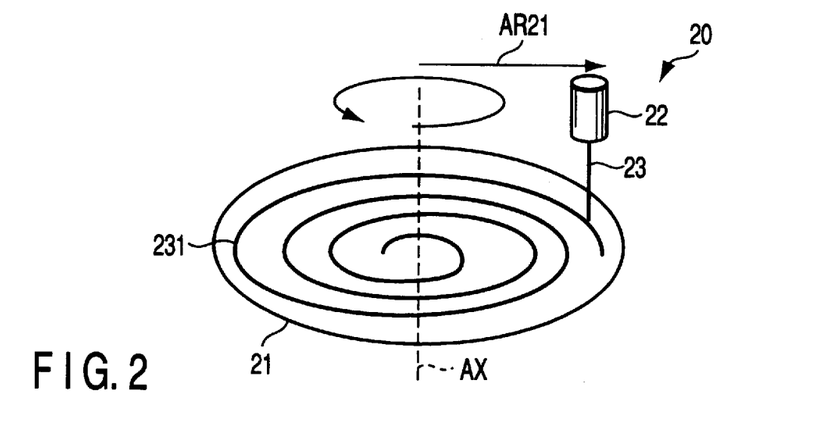
FIG. 2 schematically shows, as another example, a coating apparatus that can be used in a coating film-forming method according to another embodiment of the present invention.

FIG. 2 schematically shows, as another example, a coating apparatus that can be used for forming a coating film by a scan coating method according to another embodiment of the present invention. The coating apparatus 20 shown in FIG. 2 discharges a coating solution onto a substrate 21 in the form of a spiral line. A nozzle 22 discharging the coating solution in the form of a line 23 is moved from the center of the substrate 21 toward the periphery as denoted by an arrow AR21 while rotating the substrate 21 about an axis AX. As a result, a spiral coating solution line 231 is formed over the entire surface of the substrate 21. After the spiral coating solution line 231 is formed over the entire surface of the substrate 21, the discharge of the coating solution from the nozzle 22 is stopped. After a continuous coating solution film is formed over the substrate 21 as described previously in conjunction with FIG. 1, the next step of removing the solvent is carried out.

Figure 3:
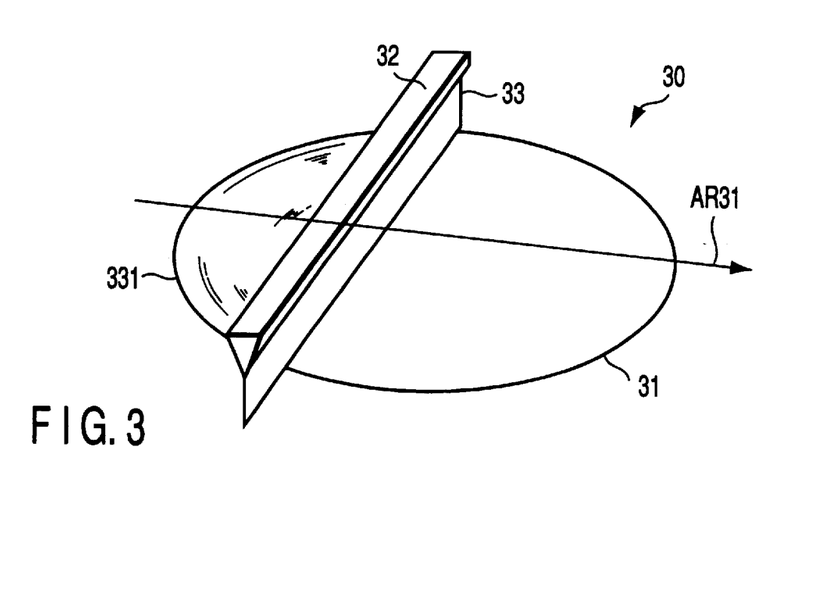
FIG. 3 schematically shows, as still another example, a coating apparatus that can be used in the coating film-forming method according to still another embodiment of the present invention.

FIG. 3 schematically shows, as still another example, a coating apparatus that can be used for forming a coating film by a scan coating method according to still another embodiment of the present invention. The coating apparatus 30 shown in FIG. 3 discharges a coating solution onto the surface of a substrate 31 in the form of a liquid film. While discharging a coating solution from a slit nozzle 32 arranged above the substrate 31 onto the substrate 31 in the form of a liquid film 33, the substrate 31 is moved in a direction perpendicular to the surface of the liquid film 33 as denoted by an arrow AR31. As soon as the scanning of the liquid film 33 over the entire surface of the substrate 31 is finished, a single continuous coating solution film 331 is formed on the entire surface of the substrate 31. Therefore, there is no need for the standing time after the application of the coating solution, which time may be necessary in some instances in the case of using the coating apparatus shown in FIG. 1 or FIG. 2, as noted above.

A method of forming a coating film according to the invention can form any kind of a coating film by the scan coating method. Particularly, a method of forming a coating film according to the invention can be effectively applied to a method of manufacturing a semiconductor device including forming at least one coating film, such as, for example, an interlayer insulating film or a resist film, on a semiconductor substrate, wherein the coating film is formed by a method of forming a coating film according to the invention.

Examples will now be described below. Needless to say, the present invention is not limited by these Examples.

Preparation Example 1 (Preparation of Coating Liquid for Forming Silica-based Insulating Film)

(A) In a separable quartz flask, 276.01 g of methyltrimethoxysilane, 86.14 g of tetramethoxysilane, and 0.0092 g of tetrakis(acetylacetonato)titanium were dissolved in 101 g of propylene glycol monoethyl ether. The resultant solution was stirred by operating a three-one motor and the solution temperature was stabilized at 55° C. Then, a mixed solution of 225.52 g of an ion exchange water and 263.00 g of propylene glycol monoethyl ether was added over one hour. The resultant reaction solution was reacted at 55° C. for 4 hours. Thereafter, 48.12 g of acetyl acetone was added, and an additional reaction was conducted for 30 minutes, followed by cooling to room temperature. Then, 227 g of solution containing methanol and water was evaporated and removed from the reaction mixture at 50° C. to concentrate the reaction mixture.

(B) Dipropylene glycol monobutyl ether, 80 g, was added to the concentrated reaction mixture obtained in (A) above, and the solution was sufficiently stirred. the resultant solution was filtered through a Teflon filter having a pore diameter of 0.2 $\mu$m to give a desired coating solution.

Preparation Example 2 (Preparation of Coating Liquid for Forming Silica-based Insulating Film)

(A) In a separable quartz flask, 370 g of distilled ethanol, 186 g of ion exchange water, and 14.6 g of a 25% aqueous solution of tetramethylammonium hydroxide were charged, and the resultant solution was uniformly stirred. Then, a mixture of 35.3 g of methyltrimethoxysilane and 54.1 g of tetraethoxysilane was added. A reaction was conducted for 5 hours, while maintaining the reaction solution at 55° C. Propylene glycol monopropyl ether, 300 g, was added to the reaction solution. Thereafter, the resultant solution was concentrated using an evaporator at 50° C. to the concentration of 10% by weight in terms of the completely hydrolyzed condensate. Then, 10 g of a 10% by weight solution of propylene glycol monopropyl ether in acetic acid was added to the concentrated solution.

(B) Dipropylene glycol monopropyl ether, 80 g, was added to the solution obtained in (A) above, and the resultant solution was sufficiently stirred. The solution thus prepared was filtered through a Teflon filter having a pore diameter 0.2 $\mu$m to give a desired coating solution.

Preparation Example 3 (Preparation of Coating Liquid for Forming SBT Film)

(A) In a separable quartz flask, 46.8 g of $Sr(O-n-C_4H_9)_2$, 188.2 g of $Bi(O-t-C_5H_{11})_3$, 162.5 g of $Ta(OC_2H_5)_5$ and 3546.0 g of propylene glycol monopropyl ether were mixed, and stirred at 25° C. for an hour to give 3943.43 g of a mixed solution containing the strontium alkoxide, the bismuth alkoxide and the tantalum alkoxide.

Then, 9.0 g of water and 885.6 g of propylene glycol monopropyl ether were mixed, and the mixture was added with 3546.0 g of the above mixed solution containing the strontium, bismuth and tantalum alkoxides. The resultant mixture was heated to 60° C. and stirred for 4 hours while heating to effect the reaction sufficiently. The resultant reaction mixture was cooled to room temperature to give a solution of an organometallic compound having the strontium, bismuth and tantalum alkoxides hydrolyzed therein.

To the solution of the organometallic compound thus obtained, 447.1 g of 2-ethylhexanoic acid was added, and the resultant solution was stirred at 30° C. for 30 minutes to effect the functional group exchange reaction of the organometallic compound. Then, the solution thus obtained was heated to 40° C. to 50° C. and stirred for 30 minutes under a reduced pressure to remove the low-boiling alcohol, followed by cooling to room temperature, giving 600.0 g of desired solution.

(B) To the solution obtained in (A) above, 1300 g of propylene glycol monopropyl ether and 100 g of dipropylene glycol dibutyl ether were added, and the mixture was stirred sufficiently. The solution thus prepared was filtered through a Teflon filter having a pore diameter of 0.2 $\mu$m, giving a desired coating solution.

Preparation Example 4 (Preparation of Coating Liquid for Forming Polyimide Film)

(A) 2,3,5-tricarboxycyclopentylacetic dianhydride, 44.8 g, and p-phenylenediamine, 21.6 g, were dissolved in 988 g of mixed solution of $\gamma$-butyrolactone/N-methyl-2-pyrrolidone (weight ratio of 50/50) and were reacted at room temperature for 6 hours. Then, the reaction mixture was poured into a large excessive amount of methanol to precipitate the reaction product. The precipitate, 30.0 g, was dissolved in 570 g of γ-butyrolactone, and added with 21.6 g of pyridine and 16.74 g of acetic anhydride. Then, an imidization reaction was carried out at 120° C. for 3 hours. The reaction mixture was poured into a large excessive amount of methanol to precipitate the reaction product. The reaction product was washed with methanol, followed by drying at 40° C. for 15 hours under a reduced pressure, giving a desired polyimide. (B) A mixture of 5 g of polyimide obtained in (A) above, 85 g of γ-butyrolactone and 10 g of dipropylene glycol dipropyl ether was sufficiently stirred. The resultant solution was filtered through a Teflon filter having a pore diameter of 1 μm, giving a desired coating solution.

Preparation Example 5 (Preparation of Coating Liquid for Forming Polyimide Film)

(A) Pyromellitic dianhydride, 43.6 g, and 4,4'-diaminodiphenyl ether, 40.0 g, were dissolved in 988 g of N-methyl-2-pyrrolidone, and reacted at room temperature for 6 hours to give a reaction mixture containing a polyimide.

(B) To the reaction mixture obtained in (A) above, 70 g of n-decanol wad added, and the resultant solution was sufficiently stirred. The solution thus prepared was filtered through a Teflon filter having a pore diameter of 1 μm, giving a desired coating solution.

Preparation Example 6 (Preparation of Coating Liquid for Forming Resist Film)

(A) Polyhydroxy styrene, 54 g, was dissolved in acetone, followed by adding 27 g of t-butyl a-bromoacetate, 10 g of potassium carbonate and 9 g of potassium iodide. The mixture was reacted for 7 hours under reflux while stirring. After completion of the reaction, the reaction mixture was added dropwise to water, and the precipitated polymer was dried overnight in a vacuum dryer at 50° C., affording a desired resist polymer.

(B) To 10 g of the resist polymer obtained in (A) above, 0.1 g of triphenylsulfonium trifluoromethanesulfonate, 0.02 g of nicotinic acid amide, 31 g of methyl 3-methoxypropionate and 5 g of dipropylene glycol monoethyl ether acetate, and the mixture was stirred sufficiently. The solution thus prepared was filtered through a Teflon filter having a pore diameter of 0.2 μm, giving a desired coating solution.

EXAMPLE 1

Using a coating apparatus as shown in FIG. 1, a nozzle discharging a coating solution in one direction was reciprocated, while a substrate was moved in a direction perpendicular to the reciprocating direction of the nozzle, forming coating solution film over the entire surface of the substrate. The coating solution used was prepared by dissolving polymethylsiloxane, which was a raw material of an insulating film, in a solvent in an amount of 5% by weight of the total amount of coating solution. The solvent used was a mixture of a main solvent of propylene glycol monopropyl ether and a sub-solvent of dipropylene glycol monobutyl ether (butyl propylene diglycol), BPDG, (a low vapor pressure solvent having a vapor pressure of 0.05 Torr (about 6.667 Pa) and a boiling point of 230.6° C.). BPDG was contained in the coating solution in an amount of 5% by weight. Then, the substrate was transferred into a reduced pressure chamber connected to a vacuum pump and the solvent was evaporated under a reduced pressure, forming a dried coating film. Subsequently, the substrate was disposed on a hot plate maintained at 400° C. to bake the dried coating film for 30 minutes, providing a stable silica-based insulating film (polymethylsiloxane insulating film) having a uniform thickness and exhibiting a relative dielectric constant of 2.7.

EXAMPLE 2

Figure 4:
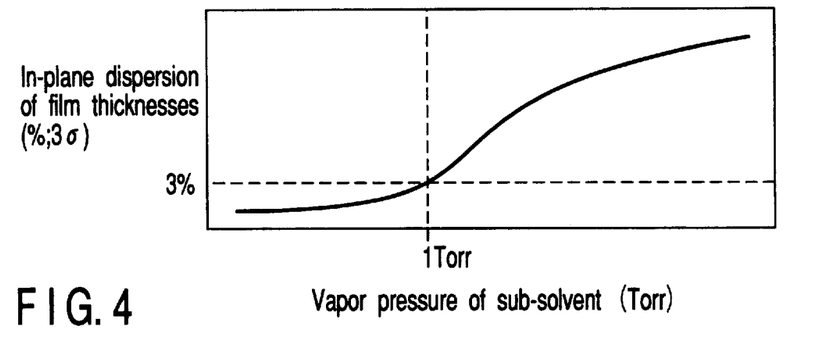
FIG. 4 is a graph showing a relationship between a vapor pressure of a solvent and an in-plane dispersion of thicknesses of a coating film.

A silica-based insulating film (polymethylsiloxane insulating film) was prepared as in Example 1, except that a coating solution was prepared by changing the kind of sub-solvents in the coating solution. FIG. 4 is a graph showing a relationship between an in-plane dispersion (3 σ; %) of thicknesses of the obtained insulating film and a vapor pressure at room temperature of the sub-solvent added to the main solvent. In-plane dispersion of the thicknesses of a silica-based insulating film becomes significantly small in the case where the vapor pressure at room temperature of the sub-solvent is lower than 1 Torr (133.322 Pa), and thus an insulating film can be obtained which can be used without applying a planarizing treatment by, for example, CMP.

EXAMPLE 3

Figure 5:
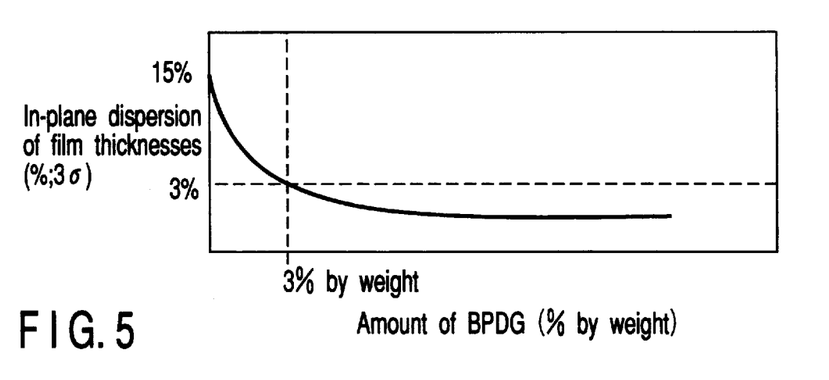
FIG. 5 is a graph showing a relationship between an amount of a low vapor pressure solvent and an in-plane dispersion of thicknesses of a coating film.

A silica-based insulating film (polymethyl siloxane insulating film) was prepared as in Example 1, except that the coating solution was prepared by changing the amount of BPDG in the coating solution. FIG. 5 is a graph showing the relationship between the in-plane dispersion (3 σ; %) of the thicknesses of the obtained insulating film and the amount of BPDG in the coating solution. As apparent from FIG. 5, an insulating film having a uniform thickness can be obtained in the case where BPDG is added in the coating solution in an amount of 3% by weight or more.

Figure 6:
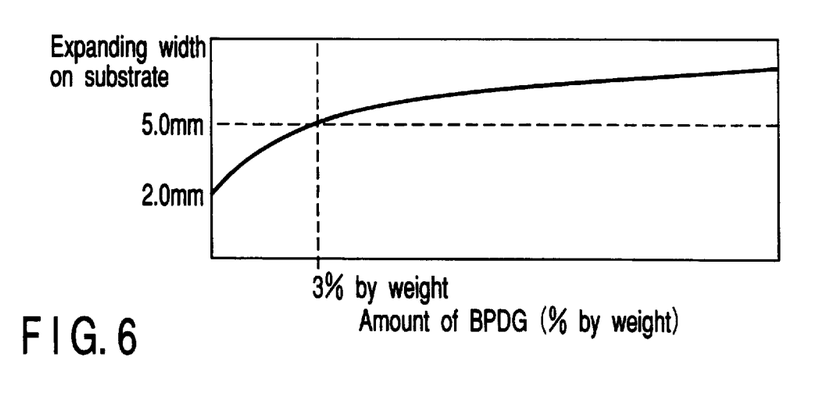
FIG. 6 is graph showing a relationship between an amount of a low vapor pressure solvent and an expanding width of a coating solution on a substrate.

The coating solutions prepared in this Example were each dripped onto the substrate in an amount of 5 μL, and the expanding width (which corresponds to the diameter) of the coating solution droplet was measured three minutes later, thereby obtaining a relationship between an amount of BPDG and an expanding width of the coating solution droplet on the substrate. FIG. 6 is a graph showing the result. As apparent from the result shown in FIG. 6, the coating solution droplet had a expanded diameter of 5 mm or more and was leveled sufficiently in the case where BPDG was added in an amount of 3% by weight or more, making it possible to form a stable liquid film. Also, when it comes to the coating solution having BPDG added therein in an amount of 3% by weight, it was possible to obtain an insulating film having the same thickness exhibiting a high uniformity in thickness, even if the amount of the discharged coating solution is reduce by 50% by increasing the solid component concentration to 10% by weight, so as to make it possible to decrease the amount of the coating solution used.

Incidentally, each of Examples 1 to 3 described above covers the case of using BPDG. However, it was possible to obtain an effect similar to decreasing the nonuniformity in the thickness of the insulating film by applying the coating solution to the surfaces of various substrates formed of, e.g., Si, p-$SiO_2$, p-SiN, and p-SiC, in the case of adding alcohols (having at least one —OH group per molecule) which have 5 to 14 carbon atoms per molecule to the coating solution in place of BPDG. It should be noted that the substance having both a hydrophobic hydrocarbon group and a hydrophilic hydroxyl group in the molecule exhibits a high affinity with many substrates so as to produce the effect of improving the leveling properties of the coating solution on the substrate, thereby making it possible to decrease the amount of coating solution used.

EXAMPLE 4

Using a coating apparatus as shown in FIG. 2, a nozzle discharging a coating solution was moved from the center of the substrate toward the periphery, while rotating the substrate, thereby forming a coating solution film over the entire surface of the substrate.

The solvent of the coating solution was a mixture of a main solvent of cyclohexanone and a sub-solvent of dipropylene glycol monopropyl ether (propyl propylene diglycol having a vapor pressure at room temperature of 0.03 Torr (about 4 Pa) and a boiling point of 212.0° C.). Dipropylene glycol monopropyl ether was contained in the coating solution in an amount of 20% by weight. Polyarylene ether providing the raw material of the insulating film was used as the coating film-forming material, which was dissolved in the coating solution in an amount of 5% by weight based on the total amount of the coating solution. Then, the substrate was placed for one minute on a first hot plate maintained at 80° C. under a $N_2$ gas atmosphere of atmospheric pressure and, then, baked for 30 minutes on a second hot plate maintained at 400° C. under a $N_2$ gas atmosphere of atmospheric pressure, thus forming a stable insulating film. In this way, a desired insulating film having a high uniformity in thickness, as in Example 1, was obtained.

EXAMPLE 5

Using a coating apparatus constructed as shown in FIG. 3, the coating solution for forming a resist film, which was prepared in Preparation Example 6, was discharged onto a substrate through a slit nozzle, while relatively moving the nozzle and the substrate, thereby forming a liquid film over the entire surface of the substrate. The resist film obtained after removal of the solvent was found to have a uniform thickness.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of forming a coating film, comprising:
   forming a coating solution film on a substrate by discharging a coating solution comprising a coating film-forming material dissolved in a solvent onto said substrate through a nozzle while relatively moving said nozzle and said substrate, said coating solution containing a low vapor pressure solvent having a vapor pressure of less than 1 Torr (133.322 Pa) at room temperature; and
   removing the solvent contained in said coating solution film.

2. The method according to claim 1, wherein said coating solution contains at least 3% by weight of said low vapor pressure solvent.

3. The method according to claim 1, wherein said low vapor pressure solvent comprises a compound having 5 to 14 carbon atoms per molecule.

4. The method according to claim 1, wherein said low vapor pressure solvent comprises a compound having at least one hydroxyl group per molecule.

5. The method according to claim 1, wherein said low vapor pressure solvent has a boiling point of 200° C. to 300° C. under atmospheric pressure.

6. The method according to claim 1, wherein said coating film-forming material forms an insulating material having a relative dielectric constant not larger than 3.3 after baking.

7. The method according to claim 1, wherein said coating film-forming material forms a silica-based insulating material.

8. The method according to claim 7, wherein said silica-based insulating material comprises a hydrolyzed condensate of at least one organic silane compound selected from the group consisting of organic silane compounds represented by formula (1) given below, organic silane compounds represented by formula (2) given below, and organic silane compounds represented by formula (3) given below:

$$R_a Si(OR^1)_{4-a} \quad (1)$$

where R is a hydrogen atom, a fluorine atom or a monovalent organic group, $R^1$ is a monovalent organic group, and a is 1 or 2;

$$Si(OR^2)_4 \quad (2)$$

where $R^2$ is a monovalent organic group;

$$R^3_b(R^4O)_{3-b}Si-(R^7)_d-Si(OR^5)_{3-c}R^6_c \quad (3)$$

where each of $R^3$ to $R^6$, which are the same or different, represents a monovalent organic group, each of b and c, which are the same or different, is an integer of 0 to 2, $R^7$ is an oxygen, a phenylene group or a group represented by $-(CH_2)_n-$, n is an integer of 1 to 6, and d is 0 or 1.

9. A method of manufacturing a semiconductor device, comprising forming at least one coating film above a semiconductor substrate, wherein said at least one coating film is formed by a method according to claim 1.

10. The method according to claim 9, wherein said coating solution contains at least 3% by weight of said low vapor pressure solvent.

11. The method according to claim 9, wherein said low vapor pressure solvent comprises a compound having 5 to 14 carbon atoms per molecule.

12. The method according to claim 9, wherein said low vapor pressure solvent comprises a compound having at least one hydroxyl group per molecule.

13. The method according to claim 9, wherein said low vapor pressure solvent has a boiling point of 200° C. to 300° C. under atmospheric pressure.

14. The method according to claim 9, wherein said coating film-forming material forms an insulating material having a relative dielectric constant not larger than 3.3 after baking.

15. The method according to claim 9, wherein said coating film-forming material forms a silica-based insulating material.

16. The method according to claim 15, wherein said silica-based insulating material comprises a hydrolyzed condensate of at least one organic silane compound selected from the group consisting of organic silane compounds represented by formula (1) given below, organic silane compounds represented by formula (2) given below, and organic silane compounds represented by formula (3) given below:

$$R_a Si(OR^1)_{4-a} \quad (1)$$

where R is a hydrogen atom, a fluorine atom or a monovalent organic group, $R^1$ is a monovalent organic group, and a is 1 or 2;

$$Si(OR^2)_4 \quad (2)$$

where $R^2$ is a monovalent organic group;

$$R^3{}_b(R^4O)_{3-b}Si-(R^7)_d-Si(OR^5)_{3-c}R^6{}_c \quad (3)$$

where each of $R^3$ to $R^6$, which are the same or different, represents a monovalent organic group, each of b and c, which are the same or different, is an integer of 0 to 2, $R^7$ is an oxygen, a phenylene group or a group represented by $-(CH_2)_n-$, n is an integer of 1 to 6, and d is 0 or 1.

* * * * *

UNITED STATES PATENT AND TRADEMARK OFFICE
CERTIFICATE OF CORRECTION

PATENT NO. : 6,645,881 B2
DATED : November 11, 2003
INVENTOR(S) : Yamada et al.

It is certified that error appears in the above-identified patent and that said Letters Patent is hereby corrected as shown below:

<u>Title page,</u>
Item [75], Inventors, "Kashi-machi (JP)" should read -- Koshi-machi (JP) --

<u>Column 20,</u>
Line 7, "said. silica-" should read -- said silica- --.
Line 24, "$R^3{}_b(R^4O)_{3-b}Si-(R^7)_d-Si(OR^5)_{3-c}R^6c$" should read
-- $R^3{}_b(R^4O)_{3-b}Si-(R^7)_d-Si(OR^5)_{3-c}R^6{}_c$ --.

<u>Column 21,</u>
Line 3, "$R^3b(R^4O)_{3-b}Si-(R^7)_d-Si(OR^5)_{3-c}R^6c$" should read
-- $R^3{}_b(R^4O)_{3-b}Si-(R^7)_d-Si(OR^5)_{3-c}R^6{}_c$ --.

Signed and Sealed this

Sixteenth Day of March, 2004

JON W. DUDAS
*Acting Director of the United States Patent and Trademark Office*